(12) United States Patent
Cho

(10) Patent No.: US 8,854,906 B2
(45) Date of Patent: Oct. 7, 2014

(54) NONVOLATILE MEMORY DEVICE WITH IMPROVED INTEGRATED RATIO

(75) Inventor: Yong Deok Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 424 days.

(21) Appl. No.: 13/225,940

(22) Filed: Sep. 6, 2011

(65) Prior Publication Data

US 2012/0057415 A1  Mar. 8, 2012

(30) Foreign Application Priority Data

Sep. 6, 2010 (KR) .................. 10-2010-0087050

(51) Int. Cl.
*G11C 7/00* (2006.01)
*G11C 29/00* (2006.01)

(52) U.S. Cl.
CPC .............. *G11C 29/84* (2013.01); *G11C 29/781* (2013.01); *G11C 29/70* (2013.01)
USPC .......................................... 365/200; 365/201

(58) Field of Classification Search
CPC ............................. G11C 29/70; G11C 29/781
USPC ................................................. 365/200, 201
See application file for complete search history.

(56) References Cited

U.S. PATENT DOCUMENTS

| | | | | |
|---|---|---|---|---|
| 5,297,085 A * | 3/1994 | Choi et al. | ............. | 365/200 |
| 6,330,198 B1 * | 12/2001 | Koshikawa | ............. | 365/200 |
| 6,510,090 B1 * | 1/2003 | Chida | ............. | 365/195 |
| 6,819,596 B2 * | 11/2004 | Ikehashi et al. | ......... | 365/185.22 |
| 7,027,330 B2 * | 4/2006 | Park | ............. | 365/185.09 |
| 7,254,076 B2 * | 8/2007 | Chae et al. | ............. | 365/207 |
| 7,352,635 B2 * | 4/2008 | Cernea | ............. | 365/189.05 |
| 7,433,251 B2 * | 10/2008 | Haraguchi et al. | ......... | 365/200 |
| 7,783,941 B2 * | 8/2010 | Kim | ............. | 714/711 |
| 8,254,203 B2 * | 8/2012 | Park | ............. | 365/238.5 |
| 8,427,872 B2 * | 4/2013 | Kim | ............. | 365/185.09 |
| 8,576,638 B2 * | 11/2013 | Kim et al. | ............. | 365/189.05 |
| 2003/0031053 A1 * | 2/2003 | Tsao et al. | ......... | 365/185.12 |
| 2003/0043628 A1 * | 3/2003 | Lee | ............. | 365/185.17 |
| 2013/0201767 A1 * | 8/2013 | Kim | ............. | 365/189.05 |

FOREIGN PATENT DOCUMENTS

| | | |
|---|---|---|
| KR | 1020050019621 | 3/2005 |
| KR | 1020080021397 | 3/2008 |
| KR | 1020080114211 | 12/2008 |
| KR | 1020090001255 | 1/2009 |

* cited by examiner

*Primary Examiner* — Kretelia Graham
(74) *Attorney, Agent, or Firm* — IP & T Group LLP

(57) ABSTRACT

A nonvolatile memory device includes a number of page buffer groups each comprising a number of normal page buffers, I/O lines corresponding to the respective normal page buffers, and a column decoder generating a column address decoding signal for coupling the normal page buffers of one of the page buffer groups and the respective I/O lines in response to a normal control clock signal.

20 Claims, 5 Drawing Sheets

NONVOLATILE MEMORY DEVICE WITH IMPROVED INTEGRATED RATIO

CROSS-REFERENCE TO RELATED APPLICATION

Priority to Korean patent application number 10-2010-0087050 filed on Sep. 6, 2010, the entire disclosure of which is incorporated by reference herein, is claimed.

BACKGROUND

Exemplary embodiments relate to a nonvolatile memory device and, more particularly, to a nonvolatile memory device which is capable of improving the degree of integration.

FIG. 1 shows the configuration of a known nonvolatile memory device.

Referring to FIG. 1, the nonvolatile memory device includes a normal memory cell array 11, a page buffer unit 12, a normal column decoder 13, a normal pre-decoder 14, a redundancy memory cell array 21, a redundancy page buffer unit 22, a redundancy column decoder 23, and a redundancy pre-decoder 24.

The known nonvolatile memory device includes a number of I/O lines IO<n−1:0> coupled to the normal column decoder 13 and a number of redundancy I/O lines RIO<k−1:0> coupled to the redundancy column decoder 23. Furthermore, the normal column decoder 13 includes a number of decoders CD<n−1:0> corresponding to the respective I/O lines IO<n−1:0> and performs a column address decoding operation on each of the I/O lines. The redundancy column decoder 23 has the same construction as the normal column decoder 13.

The known nonvolatile memory device has to send column address decoding signals CS<m−1:0> to respective page buffers (not shown) included in each page buffer group (for example, PBG<0>). Accordingly, the nonvolatile memory device includes lots of lines for sending signals. As the degree of integration of chips increases, it becomes increasing difficult to arrange the page buffers and the column decoders in the margin between bit lines.

Furthermore, the column address decoding signals CS<m−1:0> for selecting a specific page buffer are sent to the specific page buffer through transistors driven in response to pre-decoding signals a, b, and c outputted by the normal pre-decoder 14. The column address decoding signals increase resistance of a corresponding I/O line and serve as a factor to delay the transmission speed of data, stored in the page buffer, to the I/O line, thereby reducing the operating speed.

Furthermore, the nonvolatile memory device further requires a column address repair circuit unit and a circuit unit for controlling redundancy I/O lines in order to perform a column repair operation on a fail column. Accordingly, there is concern with respect to the area of the known nonvolatile memory device.

BRIEF SUMMARY

Exemplary embodiments relate to a nonvolatile memory device in which a page buffer group and I/O lines are coupled in response to a column address decoding signal generated by a column decoder circuit and the same I/O lines are shared without dividing I/O lines into normal I/O lines and redundancy I/O lines.

A nonvolatile memory device according to an aspect of the present disclosure includes a number of page buffer groups each comprising a number of normal page buffers, I/O lines corresponding to the respective normal page buffers, a column decoder generating a column address decoding signal for coupling the normal page buffers of one of the page buffer groups and the respective I/O lines in response to a normal control clock signal.

A nonvolatile memory device according to another aspect of the present disclosure includes a normal page buffer unit selectively coupled to a number of I/O lines in response to column address decoding signals and configured to receive or output data, a redundancy page buffer unit selectively coupled to the I/O lines in response to redundancy column address decoding signals and configured to receive or output data, a normal column decoder configured to generate the column address decoding signals in response to a normal control clock signal, a redundancy column decoder configured to generate the redundancy column address decoding signals in response to a redundancy control clock signal, and a redundancy circuit configured to generate the normal control clock signal and the redundancy control clock signal in response to column address signals.

A nonvolatile memory device according to another aspect of the present disclosure includes a normal page buffer unit configured to comprise a number of page buffer groups, to electrically couple a number of I/O lines and any one of the page buffer groups in response to a number of normal column address decoding signals, and to receive or output data, a redundancy page buffer unit configured to comprise a number of redundancy page buffer groups, to electrically couple the I/O lines and any one of the redundancy page buffer groups in response to a number of redundancy column address decoding signals, and to receive or output data, a normal column decoder configured to generate the column address decoding signals in response to a normal control clock signal, a redundancy column decoder configured to generate the redundancy column address decoding signals in response to a redundancy control clock signal, and a redundancy circuit configured to generate the normal control clock signal and the redundancy control clock signal in response to column address signals.

DESCRIPTION OF EMBODIMENT

Hereinafter, an exemplary embodiment of the present disclosure will be described in detail with reference to the accompanying drawings. The figures are provided to allow those having ordinary skill in the art to understand the scope of the embodiment of the disclosure.

Figure 1:
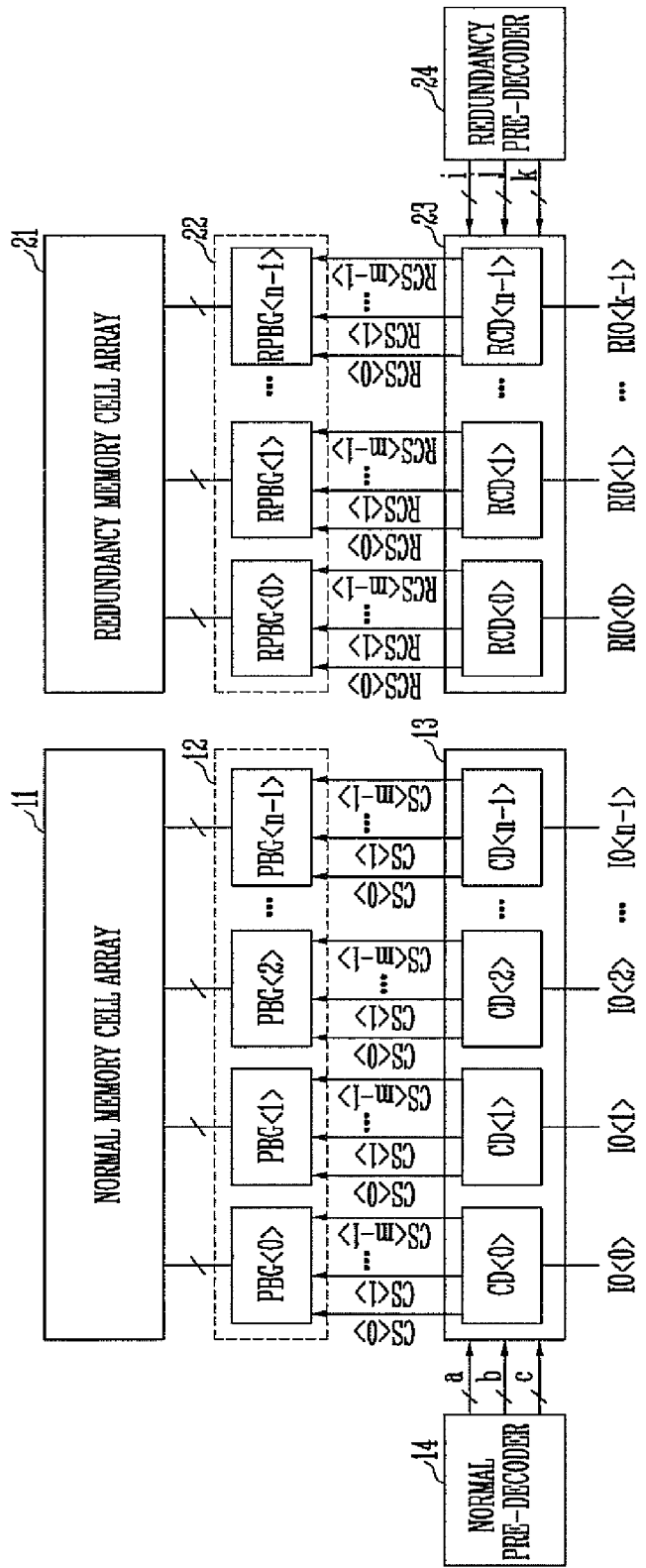
FIG. 1 shows the configuration of a known nonvolatile memory device.
Figure 2:
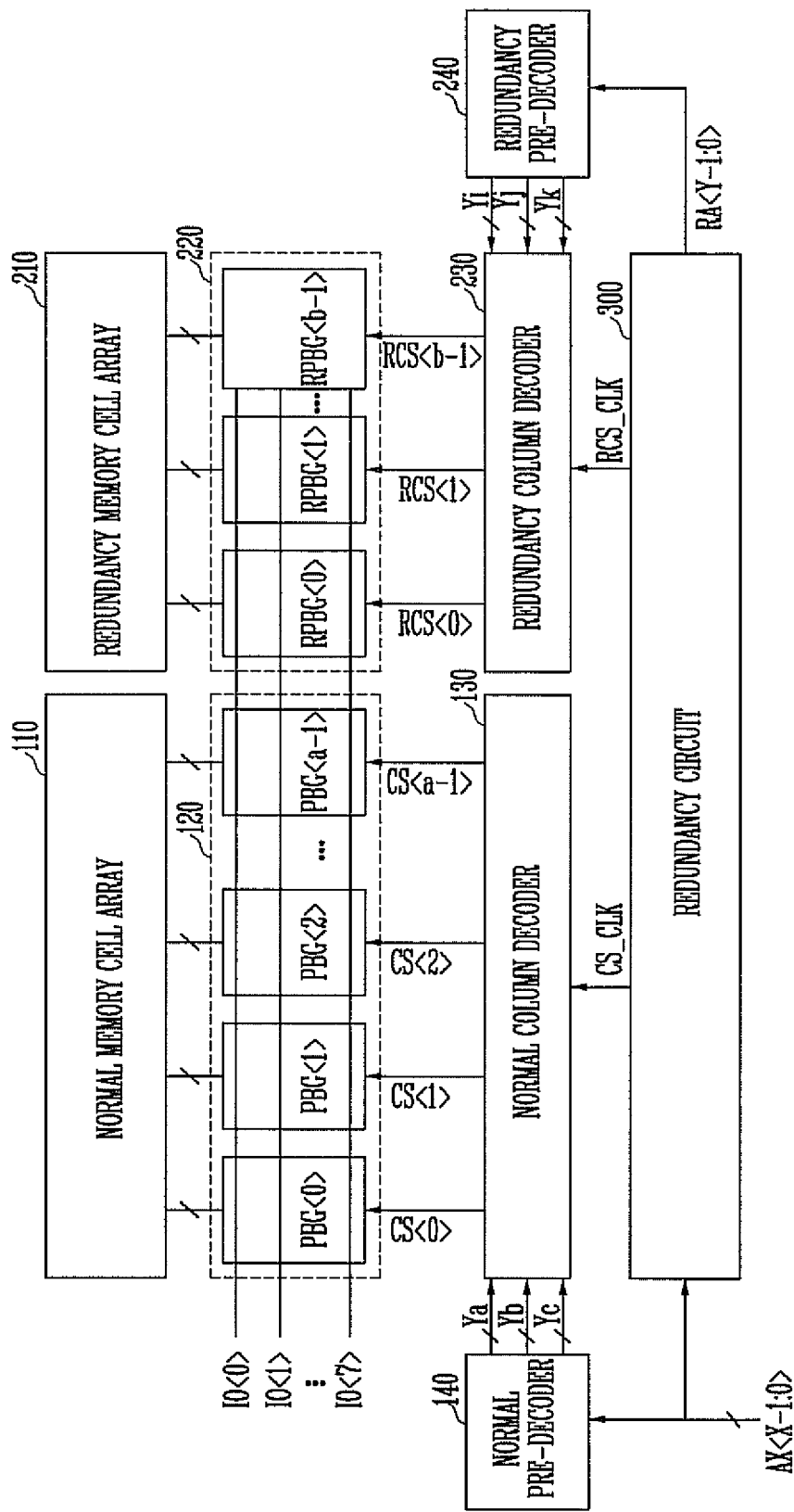
FIG. 2 shows the configuration of a nonvolatile memory device according to an exemplary embodiment of the present disclosure.

FIG. 2 shows the configuration of a nonvolatile memory device according to an exemplary embodiment of the present disclosure.

Referring to FIG. 2, the nonvolatile memory device includes a normal memory cell array 110, a normal page buffer unit 120, a normal column decoder 130, a normal pre-decoder 140, a redundancy memory cell array 210, a redundancy page buffer unit 220, a redundancy column decoder 230, a redundancy pre-decoder 240, and a redundancy circuit 300.

The normal memory cell array 110 includes a number of memory cells. The normal memory cell array 110 stores data received through the normal page buffer unit 120 during a program operation and sends data, stored during a read operation, to the normal page buffer unit 120.

The normal page buffer unit 120 temporarily stores data received through I/O lines IO<7:0> in response to column address decoding signals CS<a–1:0> generated by the normal column decoder 130 during a program operation and sends the data to the normal memory cell array 110. The normal page buffer unit 120 senses data stored in a memory cell of the normal memory cell array 110 during a read operation and outputs the sensed data to the I/O lines IO<7:0>. The normal page buffer unit 120 includes a number of page buffer groups PBG<a–1:0>. Each of the page buffer groups includes the same number of page buffers as the number of I/O lines IO<7:0>. That is, if the number of I/O lines is eight, eight page buffers are grouped to form one page buffer group.

The normal column decoder 130 generates a number of the column address decoding signals CS<a–1:0> in response to normal pre-decoding signals Ya, Yb, and Yc generated by the normal pre-decoder 140 and a normal control clock CS_CLK generated by the redundancy circuit 300.

The normal pre-decoder 140 generates the normal pre-decoding signals Ya, Yb, and Yc by decoding column address signals AX<X–1:0>.

The redundancy memory cell array 210 includes a number of memory cells. During a program operation performed in the case where received column addresses are a fail address, the redundancy memory cell array 210 stores data received through the redundancy page buffer unit 220. The redundancy page buffer unit 220 sends data, stored during a read operation, to the redundancy page buffer unit 220.

The redundancy page buffer unit 220 temporarily stores data, received through the I/O lines IO<7:0> in response to redundancy column address decoding signals RCS<b–1:0> generated by the redundancy column decoder 230 during a program operation performed in the case where received column addresses are a fail address, and sends the stored data to the redundancy memory cell array 210. The redundancy page buffer unit 220 senses data, stored in a memory cell of the redundancy memory cell array 210 during a read operation, and outputs the sensed data to the I/O lines IO<7:0>. The redundancy page buffer unit 220 includes a number of redundancy page buffer groups RPBG<b–1:0>. Each of the redundancy page buffer groups has the same number of page buffers as the number of the I/O lines IO<7:0>. That is, if the number of I/O lines is eight, eight page buffers are grouped to form one redundancy page buffer group.

The redundancy column decoder 230 generates the redundancy column address decoding signals RCS<b–1:0> in response to redundancy pre-decoding signals Yi, Yj, and Yk generated by the redundancy pre-decoder 240 and a redundancy control clock RCS_CLK generated by the redundancy circuit 300.

The redundancy pre-decoder 240 generates the redundancy pre-decoding signals Yi, Yj, and Yk by decoding redundancy column address signals RA<Y–1:0> generated by the redundancy circuit 300.

The redundancy circuit 300 generates the normal control clock CS_CLK, the redundancy control clock RCS_CLK, and the redundancy column address signals RA<Y–1:0> in response to the column address signals AX<X–1:0>.

As described above, in the nonvolatile memory device of this disclosure, each of the page buffer groups PBG<a–1:0> uses only one column address decoding signal, and the same I/O line is shared by the normal page buffer unit 120 and the redundancy page buffer unit 220 without dividing I/O lines into normal I/O lines and redundancy I/O lines. Accordingly, the degree of integration can be improved.

Figure 3:
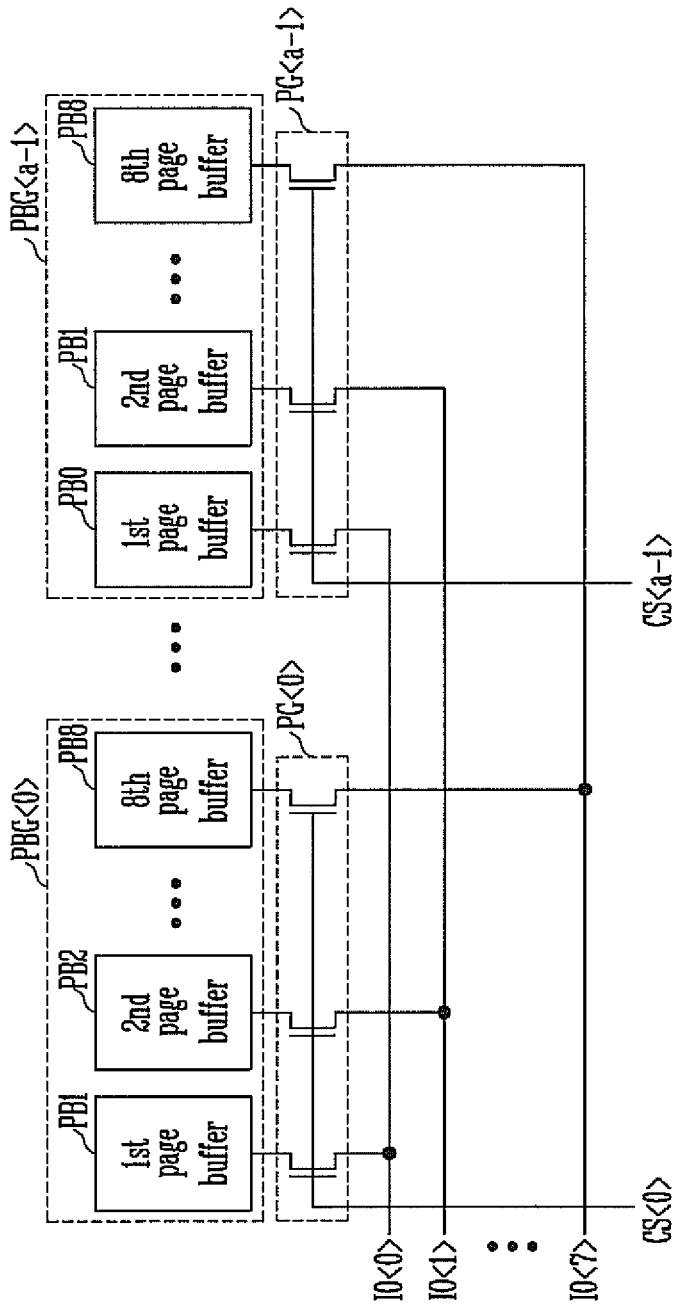
FIG. 3 shows the configuration of a normal page buffer unit shown in FIG. 2.

FIG. 3 shows the configuration of the normal page buffer unit shown in FIG. 2.

Referring to FIG. 3, one page buffer group (for example, PBG<0>) includes eight page buffers PB1 to PB8 equal to the number of I/O lines IO<7:0>. Furthermore, each of the first to eight page buffers PB1 to PB8 is coupled to any one of the I/O lines IO<7:0> in response to one (for example, CS<0>) of the column address decoding signals CS<a–1:0>. That is, one page buffer is configured to correspond to one I/O line, and the page buffer and the I/O line are coupled in response to the same column address decoding signal. The page buffer groups PBG<a–1:0> may be configured to include respective pass gate units PG<a–1:0>. Each of the pass gate units PG<a–1:0> couples one page buffer and one I/O line in response to any one of the column address decoding signals CS<a–1:0>.

Figure 4:
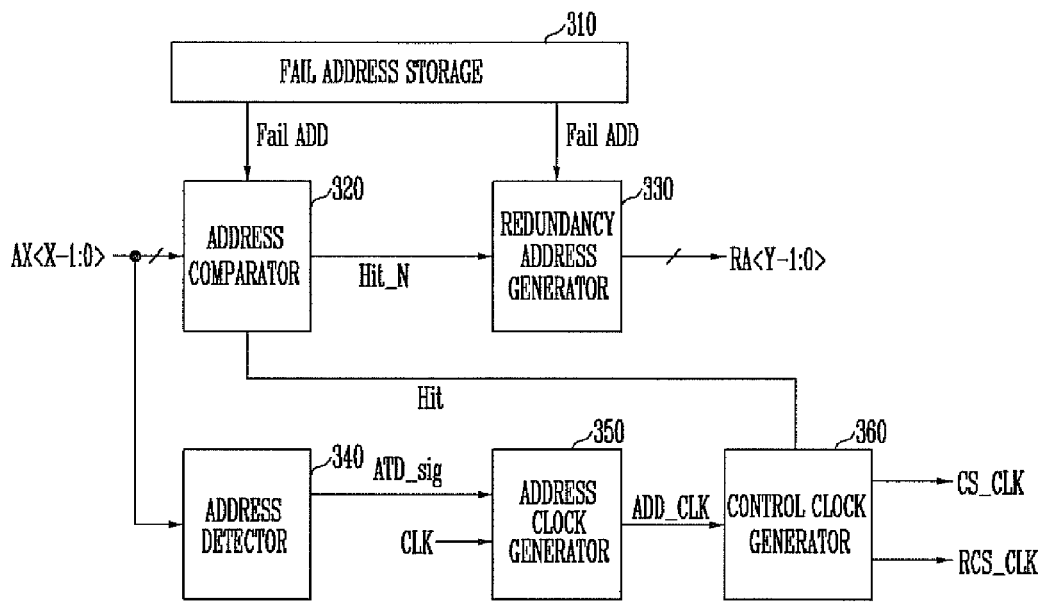
FIG. 4 shows the configuration of a redundancy circuit shown in FIG. 2.

FIG. 4 shows the configuration of the redundancy circuit 300 shown in FIG. 2.

In this disclosure, the redundancy circuit 300 controls a normal operation and a redundancy operation by activating the normal column decoder 130 and the redundancy column decoder 230 during a normal operation and a redundancy operation, respectively.

Referring to FIG. 4, the redundancy circuit 300 includes a fail address storage 310, an address comparator 320, a redundancy address generator 330, an address detector 340, an address clock generator 350, and a control clock generator 360.

The fail address storage 310 stores a fail address detected during a test operation of the nonvolatile memory device and outputs a fail address Fail_ADD when a program or read operation of the nonvolatile memory device is performed. The fail address storage 310 may be formed of a register or a fuse.

The address comparator 320 compares the column addresses AX<X–1:0> and the fail address Fail_ADD and outputs a hit signal Hit and an inverse hit signal Hit_N. That is, if the column addresses AX<X–1:0> are identical with the fail address Fail_ADD, the address comparator 320 generates the hit signal Hit activated in a high level and the inverse hit signal Hit_N activated in a low level. If the column addresses AX<X–1:0> are not identical with the fail address Fail_ADD, the address comparator 320 generates the hit signal Hit of a low level and the inverse hit signal Hit_N of a high level.

The redundancy address generator 330 generates the fail address Fail_ADD as the redundancy column addresses RA<Y–1:0> in response to the inverse hit signal Hit_N.

The address detector 340 detects a transition in the column addresses AX<X–1:0> and generates an address detection signal ATD_sig. The address detector 340 may be formed of an Address Transition Detector (ATD) circuit.

The address clock generator 350 generates an address clock ADD_CLK in response to an internal clock signal CLK and the address detection signal ATD_sig.

The control clock generator 360 generates the normal control clock CS_CLK and the redundancy control clock RCS_CLK in response to the hit signal Hit and the address clock ADD_CLK.

Figure 5:
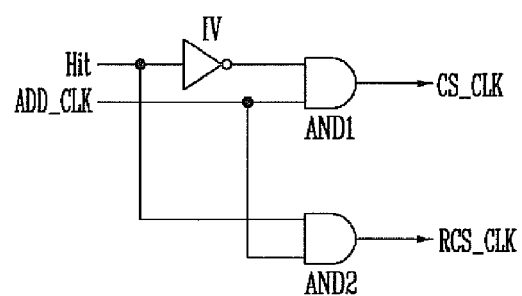
FIG. 5 is a circuit diagram of a control clock generator shown in FIG. 4.

FIG. 5 is a circuit diagram of the control clock generator 360 shown in FIG. 4.

Referring to FIG. 5, the control clock generator 360 includes an inverter IV and AND gates AND1 and AND2.

The inverter IV inverts the hit signal Hit and outputs an inverted signal to the input terminal of the AND gate AND1. The AND gate AND1 generates the normal control clock CS_CLK in response to the address clock ADD_CLK and an inverted signal of the hit signal Hit received from the inverter IV. The AND gate AND2 generates the redundancy control clock RCS_CLK in response to the hit signal Hit and the address clock ADD_CLK.

Figure 6A:
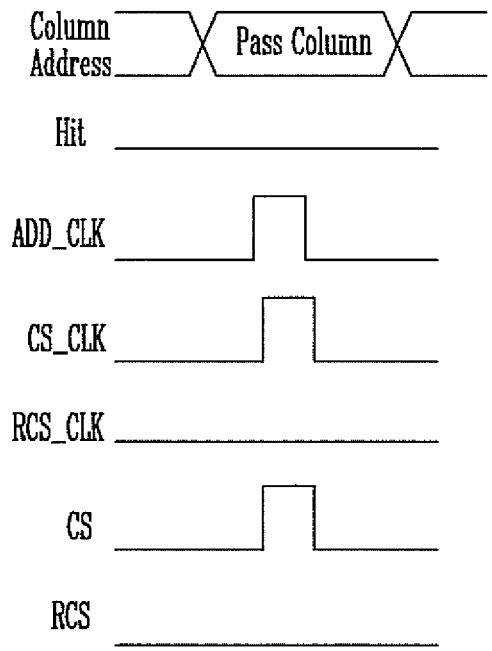
FIGS. 6A and 6B show waveforms of signals for illustrating the operation of the nonvolatile memory device shown in FIGS. 2 to 5.
Figure 6B:
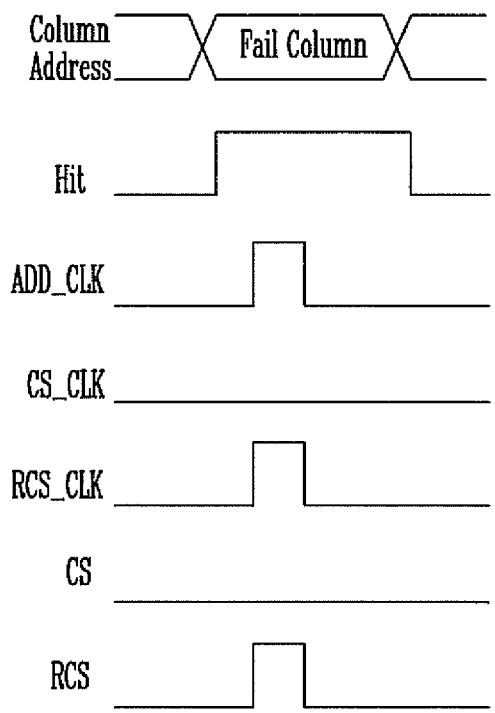

FIGS. 6A and 6B show waveforms of signals for illustrating the operation of the nonvolatile memory device shown in FIGS. 2 to 5.

The operation of the nonvolatile memory device according to an exemplary embodiment of this disclosure is described below with reference to FIGS. 2 to 6A and 6B.

A case where column addresses are a pass address is described below with reference to FIG. 6A.

The redundancy address circuit 300 generates the normal control clock CS_CLK, shifted to a high logic level, in response to the column address signals AX<X−1:0> inputted thereto. More particularly, the address detector 340 generates the address detection signal ATD_sig of a high logic level by detecting a transition in the column address signals AX<X−1:0>. The address clock generator 350 generates the internal clock CLK as the address clock ADD_CLK in response to the address detection signal ATD_sig of a high logic level. The address comparator 320 generates the hit signal Hit by comparing the column address signals AX<X−1:0> and the fail address Fail_ADD. Here, since the column address signals AX<X−1:0> are not identical with the fail address Fail_ADD, the address comparator 320 generates the hit signal Hit of a low logic level. The control clock generator 360 generates the normal control clock CS_CLK, shifted to a high logic level, in response to the address clock ADD_CLK and the hit signal Hit of a low logic level. At this time, the redundancy control clock RCS_CLK remains at a low logic level.

The normal pre-decoder 140 generates the normal pre-decoding signals Ya, Yb, and Yc by decoding the column address signals AX<X−1:0>.

The normal column decoder 130 is activated in response to the normal control clock CS_CLK, and it generates the column address decoding signals CS<a−1:0> in response to the normal pre-decoding signals Ya, Yb, and Yc. The normal page buffer unit 120 couples the I/O lines IO<7:0> and a page buffer group, selected from among the page buffer groups PBG<a−1:0>, in response to respective column address decoding signals CS<a−1:0>.

At this time, the redundancy column decoder 230 is inactivated in response to the redundancy control clock RCS_CLK. Thus, the redundancy column decoder 230 does not generate the redundancy column address decoding signals RCS<b−1:0>.

A case where received column addresses are a fail address is described below with reference to FIG. 6B.

The redundancy address circuit 300 generates the redundancy control clock RCS_CLK, shifted to a high logic level, in response to the column address signals AX<X−1:0> inputted thereto. More particularly, the address detector 340 generates the address detection signal ATD_sig of a high logic level by detecting a transition in the column address signals AX<X−1:0>. The address clock generator 350 generates the internal clock CLK as the address clock ADD_CLK in response to the address detection signal ATD_sig of a high logic level. At this time, the address comparator 320 generates the hit signal Hit by comparing the column address signals AX<X−1:0> and the fail address Fail_ADD. Since the column address signals AX<X−1:0> are identical with the fail address Fail_ADD, the address comparator 320 generates the hit signal Hit of a high logic level. The control clock generator 360 generates the redundancy control clock RCS_CLK, shifted to a high logic level in response to the address clock ADD_CLK and the hit signal Hit of a high logic level. At this time, the normal control clock CS_CLK remains at a low logic level.

The redundancy address generator 330 generates the fail address Fail_ADD as the redundancy column addresses RA<Y−1:0> in response to the inverse hit signal Hit_N of a low logic level.

The redundancy pre-decoder 240 generates the redundancy pre-decoding signals Yi, Yj, and Yk by decoding the redundancy column addresses RA<Y−1:0>.

The redundancy column decoder 230 is activated in response to the redundancy control clock RCS_CLK and generates the redundancy column address decoding signals RCS<b−1:0> in response to the redundancy pre-decoding signals Yi, Yj, and Yk. The redundancy page buffer unit 220 couples the I/O lines IO<7:0> and a page buffer group, selected from among the redundancy page buffer groups RPBG<b−1:0>, in response to the redundancy column address decoding signals RCS<b−1:0>.

At this time, the normal column decoder 130 is inactivated in response to the normal control clock CS_CLK, and it does not generate the column address decoding signals CS<a−1:0>.

In accordance with an exemplary embodiment of this disclosure, a page buffer group and I/O lines are coupled in response to a column address decoding signal generated by the column decoder circuit, and the same I/O lines are shared without dividing I/O lines into normal I/O lines and redundancy I/O lines. Accordingly, the degree of integration can be improved.

What is claimed is:

1. A nonvolatile memory device, comprising:
   a normal page buffer unit selectively coupled to a number of I/O lines in response to column address decoding signals and configured to receive or output data;
   a redundancy page buffer unit selectively coupled to the I/O lines in response to redundancy column address decoding signals and configured to receive or output data;
   a normal column decoder configured to generate the column address decoding signals in response to a normal control clock signal and normal pre-decoding signals;
   a redundancy column decoder configured to generate the redundancy column address decoding signals in response to a redundancy control clock signal and redundancy pre-decoding signals; and
   a redundancy circuit configured to generate the normal control clock signal and the redundancy control clock signal in response to column address signals.

2. The nonvolatile memory device of claim 1, wherein:
   the normal page buffer unit comprises a number of page buffer groups, and
   each of the page buffer groups comprises page buffers corresponding to the I/O lines.

3. The nonvolatile memory device of claim 1, wherein:
the redundancy page buffer unit comprises a number of redundancy page buffer groups, and
each of the redundancy page buffer groups comprises page buffers corresponding to the I/O lines.

4. The nonvolatile memory device of claim 2, wherein the normal column decoder generates the column address decoding signals corresponding to the page buffer groups.

5. The nonvolatile memory device of claim 3, wherein the redundancy column decoder generates the redundancy column address decoding signals corresponding to the redundancy page buffer groups.

6. The nonvolatile memory device of claim 2, wherein only one of the page buffer groups is selected and coupled to the I/O lines.

7. The nonvolatile memory device of claim 3, wherein only one of the redundancy page buffer groups is selected and coupled to the I/O lines.

8. The nonvolatile memory device of claim 1, further comprising a normal pre-decoder for generating the normal pre-decoding signals in response to the column address signals.

9. The nonvolatile memory device of claim 1, wherein the redundancy circuit generates redundancy column addresses in response to the column address signals.

10. The nonvolatile memory device of claim 9, further comprising a redundancy pre-decoder for generating the redundancy pre-decoding signals in response to the redundancy column addresses.

11. The nonvolatile memory device of claim 1, wherein the redundancy circuit comprises:
a fail address storage configured to store a fail address and output the fail address;
an address comparator configured to generate a hit signal by comparing the column address signals and the fail address stored in the fail address storage;
an address detector configured to generate an address detection signal by detecting a transition in the column address signals;
an address clock generator configured to generate an address clock in response to the address detection signal and an internal clock signal; and
a control clock generator configured to generate the normal control clock signal and the redundancy control clock signal in response to the hit signal and the address clock.

12. The nonvolatile memory device of claim 11, wherein the control clock generator activates the redundancy control clock signal when the column address signals represent a column address that is identical to the fail address and activates the normal control clock signal when the column address signals represent a column address that is not identical to the fail address.

13. A nonvolatile memory device, comprising:
a normal page buffer unit configured to comprise a number of page buffer groups, to electrically couple a number of I/O lines and any one of the page buffer groups in response to a number of normal column address decoding signals, and to receive or output data;
a redundancy page buffer unit configured to comprise a number of redundancy page buffer groups, to electrically couple the I/O lines and any one of the redundancy page buffer groups in response to a number of redundancy column address decoding signals, and to receive or output data;
a normal column decoder configured to generate the normal column address decoding signals in response to a normal control clock signal;
a redundancy column decoder configured to generate the redundancy column address decoding signals in response to a redundancy control clock signal; and
a redundancy circuit configured to generate the normal control clock signal and the redundancy control clock signal in response to column address signals.

14. The nonvolatile memory device of claim 13, wherein the page buffer groups of the normal page buffer unit correspond to the normal column address decoding signals.

15. The nonvolatile memory device of claim 13, wherein the redundancy page buffer groups of the redundancy page buffer unit correspond to the redundancy column address decoding signals.

16. The nonvolatile memory device of claim 13, further comprising a normal pre-decoder for generating normal pre-decoding signals in response to the column address signals.

17. The nonvolatile memory device of claim 13, wherein the redundancy circuit generates redundancy column addresses in response to the column address signals.

18. The nonvolatile memory device of claim 17, further comprising a redundancy pre-decoder for generating redundancy pre-decoding signals in response to the redundancy column addresses.

19. The nonvolatile memory device of claim 13, wherein the redundancy circuit comprises:
a fail address storage configured to store a fail address and output the fail address;
an address comparator configured to generate a hit signal by comparing the column address signals and the fail address stored in the fail address storage;
an address detector configured to generate an address detection signal by detecting a transition in the column address signals;
an address clock generator configured to generate an address clock in response to the address detection signal and an internal clock signal; and
a control clock generator configured to generate the normal control clock signal and the redundancy control clock signal, in response to the hit signal and the address clock.

20. The nonvolatile memory device of claim 19, wherein the control clock generator activates the redundancy control clock signal when the column address signals represent a column address that is identical to the fail address and activates the normal control clock signal when the column address signals represent a column address that is not identical to the fail address.

* * * * *